United States Patent
Lee et al.

(10) Patent No.: US 9,370,102 B2
(45) Date of Patent: Jun. 14, 2016

(54) EMBEDDED MULTILAYER CERAMIC ELECTRONIC COMPONENT AND PRINTED CIRCUIT BOARD HAVING EMBEDDED MULTILAYER CERAMIC ELECTRONIC COMPONENT

(71) Applicant: SAMSUNG ELECTRO-MECHANICS CO., LTD., Suwon, Gyunggi-do (KR)

(72) Inventors: Jin Woo Lee, Gyunggi-do (KR); Eun Hyuk Chae, Gyunggi-do (KR); Byoung Hwa Lee, Gyunggi-do (KR)

(73) Assignee: SAMSUNG ELECTRO-MECHANICS CO., LTD., Gyunggi-Do (KR)

( * ) Notice: Subject to any disclaimer, the term of this patent is extended or adjusted under 35 U.S.C. 154(b) by 203 days.

(21) Appl. No.: 13/770,887

(22) Filed: Feb. 19, 2013

(65) Prior Publication Data

US 2014/0182907 A1    Jul. 3, 2014

(30) Foreign Application Priority Data

Dec. 28, 2012 (KR) .................. 10-2012-0157037

(51) Int. Cl.
*H01G 4/005* (2006.01)
*H05K 1/18* (2006.01)
(Continued)

(52) U.S. Cl.
CPC ............... *H05K 1/162* (2013.01); *H01G 4/232* (2013.01); *H01G 4/2325* (2013.01); *H01G 4/30* (2013.01); *H01G 4/12* (2013.01); *H05K 1/185* (2013.01); *H05K 2201/10015* (2013.01)

(58) Field of Classification Search
CPC ................. H05K 1/162; H05K 2201/10015; H05K 1/185; H01G 4/30; H01G 4/2325; H01G 4/232; H01G 4/12

USPC ........ 361/301.1, 303, 306.1, 306.3, 313, 320, 361/321.1, 321.2, 321.3, 761, 763
See application file for complete search history.

(56) References Cited

U.S. PATENT DOCUMENTS 7,710,712 B2 * 5/2010 Takeoka ............... 361/321.2
7,719,852 B2 * 5/2010 Horie et al. ............ 361/763
(Continued)

FOREIGN PATENT DOCUMENTS

CN     102548213 A    7/2012
CN     102610387 A    7/2012
(Continued)

OTHER PUBLICATIONS

Korean Office Action issued in Korean Application No. 10-2012-0157037 dated Feb. 27, 2014, w/English translation.
(Continued)

*Primary Examiner* — Hoa C Nguyen
(74) *Attorney, Agent, or Firm* — McDermott Will & Emery LLP

(57) ABSTRACT

There is provided an embedded multilayer ceramic electronic component including: a ceramic body including dielectric layers, having first and second lateral surfaces opposing one another, and having a thickness equal to or less than 250 μm; a first internal electrode and a second internal electrode disposed to face one another with the dielectric layer interposed therebetween; a first external electrode formed on the first lateral surface of the ceramic body and electrically connected to the first internal electrode and a second external electrode formed on the second lateral surface and electrically connected to the second internal electrode; and metal layers formed on the first external electrode and the second external electrode, respectively, and including copper (Cu), wherein when a thickness of the metal layers is tp, tp≥5 μm may be satisfied.

16 Claims, 5 Drawing Sheets

(51) Int. Cl.
*H05K 1/16* (2006.01)
*H01G 4/30* (2006.01)
*H01G 4/232* (2006.01)
*H01G 4/12* (2006.01)

(56) References Cited

U.S. PATENT DOCUMENTS

| | | | | |
|---|---|---|---|---|
| 8,125,763 | B2* | 2/2012 | Kobayashi et al. | 361/309 |
| 9,111,682 | B2 | 8/2015 | Sawada et al. | |
| 2003/0128496 | A1* | 7/2003 | Allen et al. | 361/306.3 |
| 2004/0179326 | A1* | 9/2004 | Hattori | 361/320 |
| 2006/0234022 | A1* | 10/2006 | Liu et al. | 428/210 |
| 2006/0285274 | A1* | 12/2006 | Iwasaki et al. | 361/313 |
| 2009/0290284 | A1* | 11/2009 | Gabler et al. | 361/321.2 |
| 2011/0075318 | A1* | 3/2011 | Suzuki et al. | 361/303 |
| 2011/0170227 | A1* | 7/2011 | Schmid et al. | 361/301.1 |
| 2012/0007709 | A1* | 1/2012 | Taniguchi et al. | 336/200 |
| 2012/0018205 | A1* | 1/2012 | Sato et al. | 174/260 |
| 2012/0152604 | A1 | 6/2012 | Ahn et al. | |
| 2012/0188682 | A1 | 7/2012 | Sato et al. | |
| 2012/0313489 | A1* | 12/2012 | Shirakawa et al. | 310/365 |
| 2012/0327557 | A1 | 12/2012 | Ahn et al. | |
| 2013/0020905 | A1* | 1/2013 | Sawada et al. | 310/311 |

FOREIGN PATENT DOCUMENTS

| | | |
|---|---|---|
| CN | 102637527 A | 8/2012 |
| CN | 102842424 A | 12/2012 |
| JP | 2001-044066 A | 2/2001 |
| JP | 2001-156211 A | 6/2001 |
| JP | 2002-111219 A | 4/2002 |
| JP | 2005-251993 A | 9/2005 |
| JP | 2012-028456 A | 2/2012 |
| JP | 2012-028503 A | 2/2012 |
| JP | 2012-151397 A | 8/2012 |
| JP | 2012-164966 A | 8/2012 |
| JP | 2012-256947 A | 12/2012 |
| KR | 10-20080063680 | 7/2008 |
| KR | 10-20090083568 | 8/2009 |

OTHER PUBLICATIONS

Japanese Office Action issued in Japanese Application No. 2013-028698 mailed Jan. 21, 2014, 2 pgs.
Examination Report dated Jan. 13, 2015 issued in the corresponding Taiwanese Patent Application No. 102105493 (English translation).
Japanese Office Action dated Oct. 28, 2014 issued in Japanese Patent Application No. 2013-0128698 (English translation).
Office Action dated Mar. 2, 2016, in related Chinese Application No. 201310067424.5 (English Translation provided).

* cited by examiner

EMBEDDED MULTILAYER CERAMIC ELECTRONIC COMPONENT AND PRINTED CIRCUIT BOARD HAVING EMBEDDED MULTILAYER CERAMIC ELECTRONIC COMPONENT

CROSS-REFERENCE TO RELATED APPLICATIONS

This application claims the priority of Korean Patent Application No. 10-2012-0157037 filed on Dec. 28, 2012, in the Korean Intellectual Property Office, the disclosure of which is incorporated herein by reference.

BACKGROUND OF THE INVENTION

1. Field of the Invention

The present invention relates to an embedded multilayer ceramic electronic component and a printed circuit board (PCB) having an embedded multilayer electronic component.

2. Description of the Related Art

As electronic circuits have become highly densified and highly integrated, a mounting space for passive elements mounted on a printed circuit board (PCB) has become insufficient, and in order to solve this problem, ongoing efforts have been made to implement components able to be installed within a board, i.e., embedded devices. In particular, various methods have been proposed for installing a multilayer ceramic electronic component used as a capacitive component within a board.

In one of a variety of methods of installing a multilayer ceramic electronic component within a board, the same dielectric material used for a multilayer ceramic electronic component is used as a material for a board and a copper wiring, or the like, is used as an electrode. Other methods for implementing an embedded multilayer ceramic electronic component include a method of forming an embedded multilayer ceramic electronic component by forming a polymer sheet having high-k dielectrics and a dielectric thin film within a board, a method of installing a multilayer ceramic electronic component within a board, and the like.

In general, a multilayer ceramic electronic component includes a plurality of dielectric layers made of a ceramic material, and internal electrodes interposed between the dielectric layers. By disposing a multilayer ceramic electronic component within a board, an embedded multilayer ceramic electronic component having high capacitance may be implemented.

In order to manufacture a printed circuit board (PCB) including an embedded multilayer ceramic electronic component, a multilayer ceramic electronic component may be inserted into a core board, and via holes are required to be formed in an upper laminated plate and a lower laminated plate by using a laser in order to connect board wirings and external electrodes of the multilayer ceramic electronic component. Laser beam machining, however, considerably increases manufacturing costs of a PCB.

In the process of embedding a multilayer ceramic electronic component in a board, an epoxy resin is cured and a thermal treatment process is performed to crystallize a metal electrode, and in this case, differences between coefficients of thermal expansion of an epoxy resin, a metal electrode, a ceramic element of the multilayer ceramic electronic component, and the like, or thermal expansion of the board, may cause a defect on the bonding surface of the board and the multilayer ceramic electronic component. Such a defect may cause delamination of the bonding surface, or the like, during a reliability test.

Meanwhile, in case that a multilayer ceramic capacitor (MLCC) is used as a decoupling capacitor of a high performance IC power terminal such as an application processor of a smartphone, a CPU of a PC, or the like, performance of the IC may be degraded when equivalent series inductance (ESL) is increased, and as smartphones and PC CPUs have increasingly high performance, an increase in the ESL of an MLCC may increasingly affect a degradation of performance of the IC.

A so-called low inductance chip capacitor (LICC) has been devised to reduce inductance by reducing a path of a current flow by reducing a distance between external terminals.

In the case of an embedded multilayer ceramic electronic component, there is a need to apply such an LICC in order to reduce inductance as mentioned above.

RELATED ART DOCUMENT (Patent document 1) Korean Patent Laid Open Publication No. 2009-0083568

SUMMARY OF THE INVENTION

An aspect of the present invention provides an embedded multilayer ceramic electronic component and a printed circuit board (PCB) having an embedded multilayer ceramic electronic component.

According to an aspect of the present invention, there is provided an embedded multilayer ceramic electronic component including: a ceramic body including dielectric layers, having first and second main surfaces opposing one another, first and second lateral surfaces opposing one another, and first and second end surfaces opposing one another, and having a thickness equal to or less than 250 μm; a first internal electrode and a second internal electrode disposed to face one another with the dielectric layer interposed therebetween and alternately exposed to the first lateral surface and the second lateral surface, respectively; a first external electrode formed on the first lateral surface of the ceramic body and electrically connected to the first internal electrode and a second external electrode formed on the second lateral surface and electrically connected to the second internal electrode; and metal layers formed on the first external electrode and the second external electrode, respectively, and including copper (Cu), wherein the ceramic body may include an active layer including the first internal electrodes and the second internal electrodes and a cover layer formed on an upper or lower surface of the active layer, and when a thickness of the metal layers is tp, tp≥5 μm may be satisfied.

When a thickness of the ceramic body is a distance between the first main surface and the second main surface, a width of the ceramic body is a distance between the first lateral surface on which the first external electrode is formed and the second lateral surface on which the second external electrode is formed, and a length of the ceramic body is a distance between the first end surface and the second end surface, the width of the ceramic body may be shorter than or equal to the length of the ceramic body.

When the length of the ceramic body is L and the width thereof is W, 0.5≤W≤L may be satisfied.

When surface roughness of the ceramic body is Ra1 and a thickness of the cover layer is tc, 120 nm≤Ra1≤tc may be satisfied.

When surface roughness of the metal layers is Ra2 and a thickness of the metal layers is tp, 200 nm≤Ra2≤tp may be satisfied.

The first and second external electrodes may extend to the first and second main surfaces of the ceramic body, and a width of the first and second external electrodes formed on the first and second main surfaces may be equal to or greater than 200 μm, respectively.

A distance between the first and second external electrodes formed on the first and second main surfaces may be equal to or greater than 100 μm.

The thickness tc of the cover layer may range from 1 μm to 30 μm.

The metal layers may be formed through plating.

According to another aspect of the present invention, there is provided a printed circuit board (PCB) having an embedded multilayer ceramic electronic component, including: an insulating substrate; and an embedded multilayer ceramic electronic component including a ceramic body including dielectric layers, having first and second main surfaces opposing one another, first and second lateral surfaces opposing one another, and first and second end surfaces opposing one another, and having a thickness equal to or less than 250 μm, a first internal electrode and a second internal electrode disposed to face one another with the dielectric layer interposed therebetween and alternately exposed to the first lateral surface and the second lateral surface, respectively, a first external electrode formed on the first lateral surface of the ceramic body and electrically connected to the first internal electrode and a second external electrode formed on the second lateral surface and electrically connected to the second internal electrode, and metal layers formed on the first external electrode and the second external electrode, respectively, and including copper (Cu), wherein the ceramic body may include an active layer including the first internal electrodes and the second internal electrodes and a cover layer formed on an upper or lower surface of the active layer, and when a thickness of the metal layers is tp, tp≥5 μm may be satisfied.

When a thickness of the ceramic body is a distance between the first main surface and the second main surface, a width of the ceramic body is a distance between the first lateral surface on which the first external electrode is formed and the second lateral surface on which the second external electrode is formed, and a length of the ceramic body is a distance between the first end surface and the second end surface, the width of the ceramic body may be shorter than or equal to the length of the ceramic body.

When the length of the ceramic body is L and the width thereof is W, 0.5≤L≤W L may be satisfied.

When surface roughness of the ceramic body is Ra1 and a thickness of the cover layer is tc, 120 nm≤Ra1≤tc may be satisfied.

When surface roughness of the metal layers is Ra2 and a thickness of the metal layers is tp, 200 nm≤Ra2≤tp may be satisfied.

The first and second external electrodes may extend to the first and second main surfaces of the ceramic body, and a width of the first and second external electrodes formed on the first and second main surfaces may be equal to or greater than 200 μm, respectively.

A distance between the first and second external electrodes formed on the first and second main surfaces may be equal to or greater than 100 μm.

The thickness tc of the cover layer may range from 1 μm to 30 μm.

The metal layers may be formed through plating.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
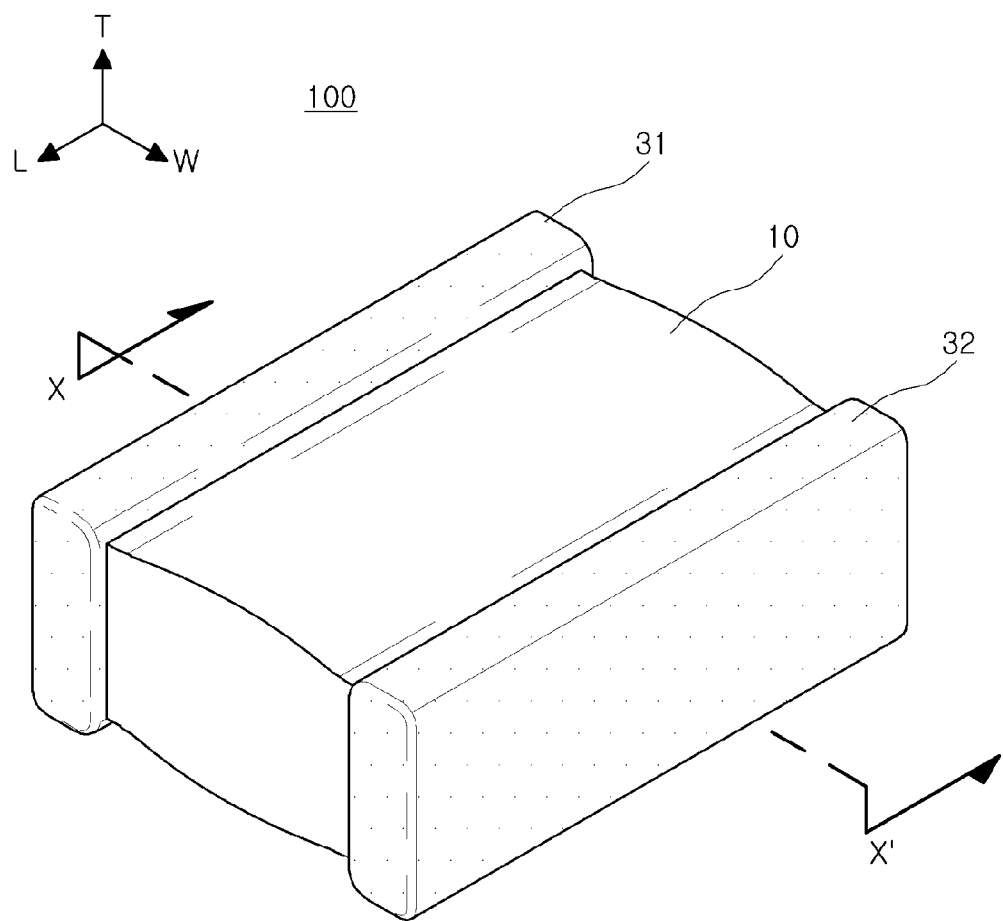
FIG. 1 is a perspective view of an embedded multilayer ceramic electronic component according to an embodiment of the present invention.

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

Unless explicitly described to the contrary, the word "comprise" and variations such as "comprises" or "comprising," will be understood to imply the inclusion of stated elements but not the exclusion of any other elements.

In order to clarify the present invention, parts irrespective of description will be omitted, and in order to clearly express several layers and regions, thicknesses are exaggerated, and similar reference numerals are used for similar parts throughout the specification.

Figure 2:
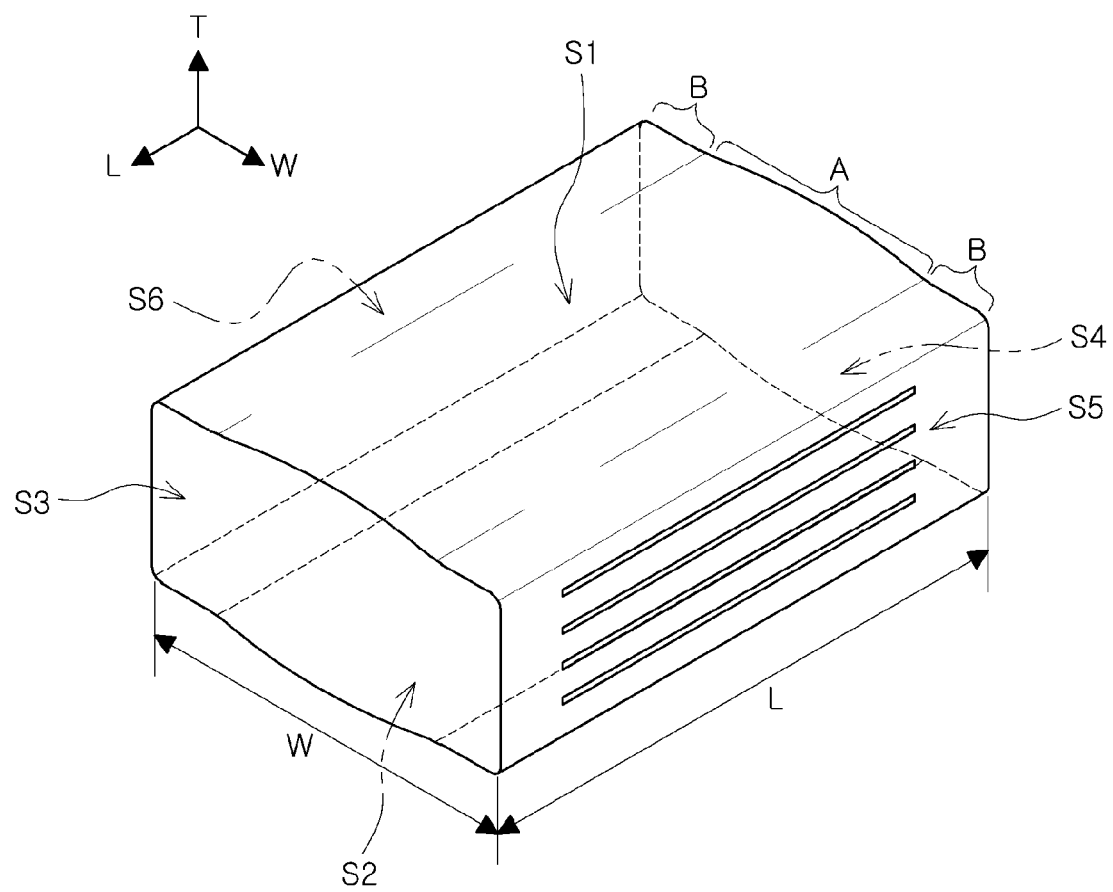
FIG. 2 is a schematic view of a ceramic body according to an embodiment of the present invention.
Figure 3:
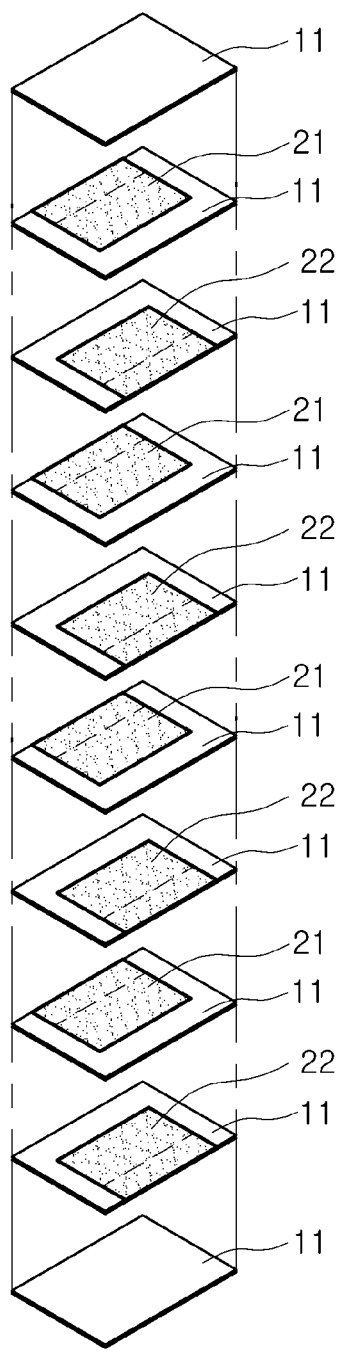
FIG. 3 is an exploded perspective view of the ceramic body of FIG. 2.
Figure 4:
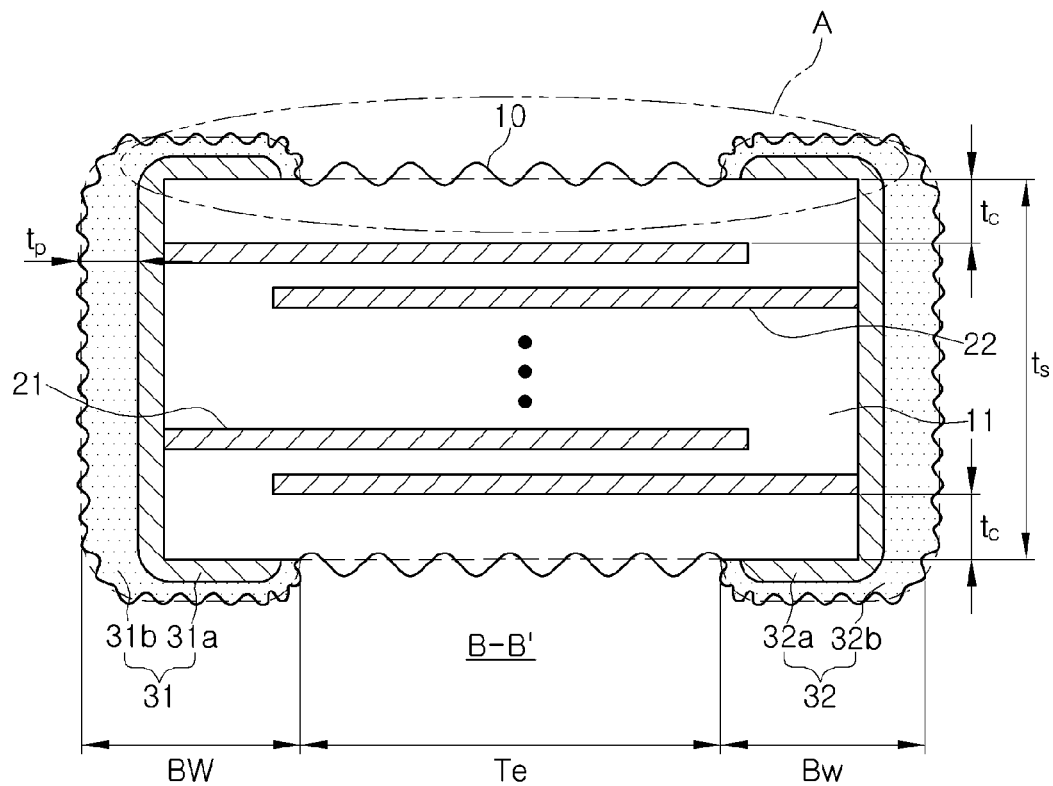
FIG. 4 is a cross-sectional view of the ceramic body of FIG. 2 taken along line X-X'.
Figure 5:
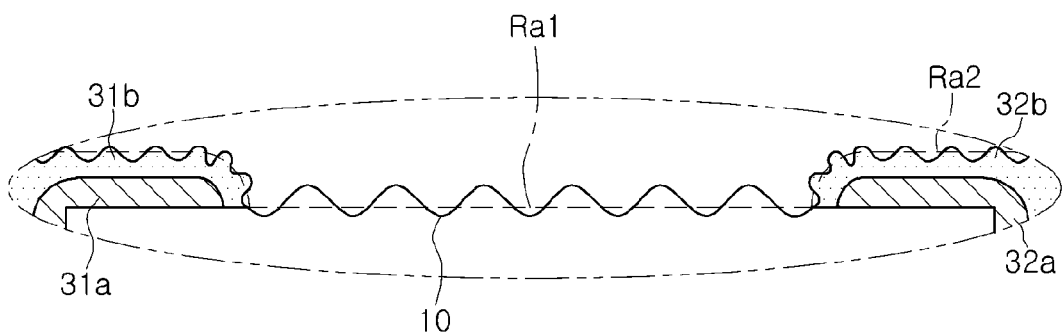
FIG. 5 is an enlarged view of region 'A' in FIG. 4.

FIG. 1 is a perspective view of an embedded multilayer ceramic electronic component according to an embodiment of the present invention. FIG. 2 is a schematic view of a ceramic body according to an embodiment of the present invention. FIG. 3 is an exploded perspective view of the ceramic body of FIG. 2. FIG. 4 is a cross-sectional view of the ceramic body of FIG. 2 taken along line X-X'. FIG. 5 is an enlarged view of region 'A' in FIG. 4.

Referring to FIGS. 1 through 5, an embedded multilayer ceramic electronic component according to an embodiment of the present invention may include a ceramic body 10 including dielectric layers 11, having first and second main surfaces S1 and S2 opposing one another, first and second lateral surfaces S5 and S6 opposing one another, and first and second end surfaces S3 and S4 opposing one another, and having a thickness equal to or less than 250 μm; a first internal electrode 21 and a second internal electrode 22 disposed to face one another with the dielectric layer 11 interposed therebetween and alternately exposed to the first lateral surface S5 and the second lateral surface S6, respectively; a first external electrode 31a formed on the first lateral surface S5 of the ceramic body 10 and electrically connected to the first internal electrode 21 and a second external electrode 32a formed on the second lateral surface S6 and electrically connected to the second internal electrode 22; and plated layers 31b and 32b formed on the first external electrode 31a and the second external electrode 32a, respectively.

Hereinafter, a multilayer ceramic electronic component according to an embodiment of the present invention will be described. In particular, a multilayer ceramic capacitor (MLCC) will be described as an example, but the present invention is not limited thereto.

In the multilayer ceramic capacitor (MLCC) according to an embodiment of the present invention, it is defined that a 'length direction' is the 'L' direction, a 'width direction' is the 'W' direction, and a 'thickness direction' is the 'T' direction in FIG. 1. Here, the 'thickness direction' may be used to have the same concept as a 'lamination direction' in which dielectric layers are laminated.

In an embodiment of the present invention, the ceramic body 10 may have the first main surface S1 and the second main surface S2 opposing one another and the first lateral surface S5, the second lateral surface S6, the first end surface S3, and the second end surface S4 connecting the first main surface S1 and the second main surface S2. As illustrated, the ceramic body 110 may have a hexahedral shape, but the shape of the ceramic body 110 is not particularly limited.

A material used to form the dielectric layers 1 is not particularly limited as long as it can obtain sufficient capacitance. For example, barium titanate ($BaTiO_3$) powder may be used.

As for the material of the dielectric layers 1, various ceramic additives, an organic solvent, a plasticizer, a bonder, a dispersing agent, and the like, may be added to the barium titanate ($BaTiO_3$) powder, or the like, according to purposes of the present invention.

An average particle diameter of the ceramic powder used to form the dielectric layers 1 is not particularly limited and may be adjusted to achieve the purpose of the present invention. For example, the average particle diameter of the ceramic powder may be adjusted to be equal to or less than 400 nm.

A material used to form the first and second internal electrodes 21 and 22 is not particularly limited and may be formed with a conductive paste including one or more of materials among, for example, a precious metal such as palladium (Pd), a palladium-silver (Pd—Ag) alloy, and the like, and nickel (Ni) and copper (Cu).

The first and second internal electrodes 21 and 22 may be disposed to face one another with the dielectric layer 11 interposed therebetween, and may be alternately exposed to the first lateral surface S5 and the second lateral surface S6.

Since the first internal electrode and the second internal electrode 21 and 22 are alternately exposed to the first lateral surface S5 and the second lateral surfaces S6, a reverse geometry capacitor (RGC) or a low inductance chip capacitor (LICC) may be implemented as described hereinafter.

A thickness is of the ceramic body 10 may be equal to or less than 250 μm.

Since the ceramic body 10 is fabricated to have the thickness ts equal to or less than 250 μm, it may be appropriate as an embedded multilayer ceramic capacitor (MLCC).

Also, the thickness ts of the ceramic body 10 may be a distance between the first main surface S1 and the second main surface S2.

According to an embodiment of the present invention, the external electrodes 31 and 32 including the first and second external electrodes 31a and 32a and the metal layers 31b and 32b including copper (Cu) formed on the first and second external electrodes may be formed, respectively.

In order to form capacitance, the first and second external electrodes 31a and 32a may be formed on an outer side of the ceramic body 10 and may be electrically connected to the first and second internal electrodes 21 and 22.

The first and second external electrodes 31a and 32a may be made of the same conductive material as that of the first and second internal electrodes 21 and 22, but the present invention is not limited thereto and the first and second external electrodes 31a and 32a may be made of, for example, copper (Cu), silver (Ag), nickel (Ni), or the like.

The first and second external electrodes 31a and 32a may be formed by applying a conductive paste prepared by adding glass frit to the metal powder and firing the same.

A general MLCC may have a length longer than a width thereof, and external electrodes may be disposed on end surfaces opposing one another in a length direction of a ceramic body.

In this case, when an alternating current (AC) voltage is applied to the external electrodes, since a path of the current is relatively long, a current loop may be formed to be increased to expand an induced magnetic field to increase inductance.

In the MLCC according to an embodiment of the present invention, the first and second external electrodes 31 and 32 may be formed on the first and second lateral surfaces S5 and S6 of the ceramic body 10 in order to reduce a current path.

A width of the ceramic body 10 may be equal to a distance between the first lateral surface S5 on which the first external electrode 31 is formed and the second lateral surface S6 on which the second external electrode is formed, and a length L of the ceramic body 10 may be equal to a distance between the first end surface S3 and the second end surface S4.

According to an embodiment of the present invention, the width W from the first lateral surface S5 to the second lateral surface S6 on which the first and second external electrodes 31 and 32 are formed, respectively, may be shorter than or equal to the length L from the first end surface S3 to the second end surface S4.

Accordingly, the distance between the first and second external electrodes 31 and 32 is reduced, reducing a current path, and thus, a current loop is reduced to reduce inductance.

The multilayer ceramic electronic component in which the first and second external electrodes 31 and 32 are formed on the first and second lateral surfaces S5 and S6 of the ceramic body 10 so that the width W of the ceramic body 10 (namely, the distance between the first and second external electrodes 31 and 32) is shorter than or equal to the length L of the ceramic body 10 may be called a reverse geometry capacitor (RGC) or a low inductance chip capacitor (LICC).

Also, when the length of the ceramic body 10 is L and the width thereof is W, $0.5 \, L \leq W \leq L$ may be satisfied, but the present invention is not limited thereto.

In this manner, by adjusting the length and width of the ceramic body 10 to satisfy $0.5 \, L \leq W \leq L$, inductance of the MLCC can be reduced.

Therefore, since the multilayer ceramic electronic component according to an embodiment of the present invention implements low inductance, electrical performance thereof can be enhanced.

According to an embodiment of the present invention, the metal layers 31b and 32b including copper (Cu) may be formed on the first external electrode 31a and the second external electrode 32a, respectively.

In general, an MLCC is mounted on a PCB, so a nickel/tin plated layer is formed on external electrodes.

However, the MLCC according to an embodiment of the present invention is embedded in a PCB, rather than being mounted thereon, so the first external electrode 31a and the second external electrode 32a of the MLCC are electrically connected to circuits of the board through a via made of copper (Cu).

Thus, according to an embodiment of the present invention, the metal layers 31b and 32b including copper (Cu) may include copper (Cu) having excellent electrical connectivity with copper (Cu) as a material of the via within the board.

A method for forming the metal layers 31b and 32b including copper (Cu) is not particularly limited. For example, the metal layers 31b and 32b may be formed through plating, and in this case, the metal layers 31b and 32b may be formed as plated layers including copper (Cu).

Referring to FIGS. 4 and 5, the ceramic body 10 of the multilayer ceramic electronic component according to an embodiment of the present invention may include an active layer including the first and second internal electrodes 21 and 22 and a cover layer formed on upper or lower surface of the active layer. When a thickness of the metal layers 31b and 32b is tp, tp≥5 μm may be satisfied.

The ceramic body 10 may include the active layer including the first and second internal electrodes 21 and 22, and here, the active layer may refer to a layer contributing to a formation of capacitance.

Also, the ceramic body 10 may include the cover layer formed on an upper or lower surface of the active layer.

The thickness tp of the metal layers 31b and 32b may satisfy tp≥5 μm, but the present invention is not limited thereto and the thickness tp of the metal layers 31b and 32b may be equal to or less than 15 μm.

Since the thickness tp of the metal layers 31b and 32b satisfies tp≥5 μm and is adjusted to be equal to or less than 15 μm, via processing within the board is excellent, and an MLCC having high reliability can be implemented.

If the thickness tp of the metal layers 31b and 32b is less than 5 μm, when the multilayer ceramic electronic component is embedded in the PCB 100, a conductive via hole 140 may be processed to be connected to the ceramic body 10, generating a defect.

If the thickness tp of the metal layers 31b and 32b exceeds 5 μm, cracks may be generated in the ceramic body 10 due to stress of the metal layers 31b and 32b.

Meanwhile, when surface roughness of the metal layers 31b and 32b is Ra2 and the thickness of the metal layers 31b and 32b is tp, 200 nm≤Ra2≤tp may be satisfied.

By adjusting the surface roughness Ra2 of the metal layers 31b and 32b to satisfy 200 nm≤Ra2≤tp, a delamination phenomenon occurring between the multilayer ceramic electronic component and the board can be improved and a generation of cracks may be prevented.

Also, when surface roughness of the ceramic body is Ra1 and a thickness of the cover layer is tc, 120 nm≤Ra1≤tc may be satisfied.

By adjusting the surface roughness Ra1 of the ceramic body 10 to satisfy 120 nm≤Ra1≤tc, a delamination phenomenon occurring between the multilayer ceramic electronic component and the board can be improved and a generation of cracks may be prevented.

Surface roughness refers to a degree of fine depressions and protrusions formed on a metal surface when the metal surface is processed.

Surface roughness is generated due to a tool used for processing, whether or not a processing method is appropriate, grooves formed as a surface is scratched, rust, or the like. In determining a degree of roughness, a surface is cut in a direction perpendicular thereto and a cross-section thereof having a certain curvature is checked. A height from the lowest point to the highest point of the curved line is taken and determined as an average central line roughness denoted by Ra.

In the present embodiment, it is defined that surface roughness of the ceramic body 10 is Ra1 and an average central line roughness of the plated layers 31b and 32b is Ra2.

FIG. 5 is an enlarged view of region 'A' showing the average central line roughness Ra1 of the ceramic body 10 and the average central line roughness Ra2 of the plated layers 31b and 32b.

Referring to FIG. 5, in the multilayer ceramic electronic component of the present invention, when the surface roughness of the ceramic body 10 is Ra1 and the thickness of the cover layer is tc, 120 nm≤Ra1≤tc may be satisfied, and when the surface roughness of the metal layers 31b and 32b is Ra2 and the thickness of the metal layers 31b and 32b is tp, 200 nm≤Ra2≤tp may be satisfied.

The average central line roughness Ra1 of the ceramic body 10 and the average central line roughness Ra2 of the metal layers 31b and 32b are calculated values of roughness of the ceramic body 10 and the metal layers 31b and 32b, respectively, and these values may refer to roughness of the ceramic body 10 and the metal layers 31b and 32b obtained by calculating average values based on virtual central lines of the roughness.

In detail, referring to FIG. 5, in order to calculate the average central line roughness Ra1 of the ceramic body 10 and the average central line roughness Ra2 of the metal layers 31b and 32b, a virtual central line may be drawn with respect to roughness formed on one surfaces of the ceramic body 10 and the metal layers 31b and 32b.

Next, respective distances (e.g., $r_1, r_2, r_3 \ldots r_{13}$) based on the virtual central line of roughness are measured and average values of the respective distances are calculated to be obtained as the average central line roughness Ra1 of the ceramic body 10 and the average central line roughness Ra2 of the metal layers 31b and 32b, respectively.

$$R_a = \frac{|r_1| + |r_2| + |r_3| + \ldots |r_n|}{n}$$

The average central line roughness Ra1 of the ceramic body 10 and the average central line roughness Ra2 of the metal layers 31b and 32b are adjusted to be within the range of 120 nm≤Ra1≤tc and 200 nm≤Ra2≤tp, respectively, thereby implementing a multilayer ceramic electronic component having excellent withstand voltage characteristics and high reliability with enhanced adhesive strength with respect to a board.

If the surface roughness of the ceramic body 10 is less than 120 nm and the surface roughness of the metal layers 31b and 32b is less than 200 nm, a delamination phenomenon may occur between the multilayer ceramic electronic component and the board.

Meanwhile, if the surface roughness of the ceramic body 10 exceeds the thickness tc of the cover sheet of the ceramic body 10 and the surface roughness of the metal layers 31b and 32b exceeds the thickness tp of the metal layers 31b and 32b, cracks may be generated.

Also, the thickness tc of the cover layer may range from 1 μm to 30 μm, but the present invention is not limited thereto.

If the thickness tc of the cover layer is less than 1 μm, the cover layer is so thin that external shock is transferred to the active layer as an internal capacitance formation part to cause a defect. If the thickness tc of the cover layer exceeds 30 μm, the cover layer is so thick that the capacitance formation part is relatively reduced, making it difficult to implement capacitance.

The thicknesses of the metal layers 31b and 32b and the cover layer may refer to average thicknesses.

Average thicknesses of the metal layers 31b and 32b and the cover layer may be measured by scanning an image of a length directional cross-section of the ceramic body 10 by a scanning electron microscope (SEM) as shown in FIG. 4.

For example, as illustrated in FIG. 4, from an image obtained by scanning a length and thickness (L-T) directional cross-section taken in the width (W) directional central portion of the ceramic body 10 by using an SEM, thicknesses of the metal layers 31b and 32b and the cover layer may be measured to be obtained.

Meanwhile, according to an embodiment of the present invention, the first and second external electrodes 31a and 32a may extend to the first and second main surfaces S1 and S2 of the ceramic body 10, respectively, and in this case, a width BW of the first and second external electrodes 31a and 31b formed on the first and second main surfaces S1 and S2 may be 200 μm, respectively, and the present invention is not limited thereto.

Since the width BW of the first and second external electrodes 31a and 31b is formed to be equal to or greater than 200 μm, respectively, inductance may be reduced and a defective contact between a circuit and a via when the MLCC is embedded in the board can be solved.

If the width BW of the first and second external electrodes 31a and 31b is less than 200 μm, when the MLCC is embedded in the board, a defective contact problem between a circuit and a via may arise.

Meanwhile, a distance Te between the first and second external electrodes 31a and 31b formed on the first and second main surfaces S1 and S2 may be equal to or greater than 100 μm.

By adjusting the distance between the first and second external electrodes 31a and 31b formed on the first and second main surfaces S1 and S2 to be equal to or greater than 100 μm, an MLCC having high reliability can be implemented.

If the distance between the first and second external electrodes 31a and 31b is less than 100 μm, the distance between the electrodes having different polarities is so short that a short defect may occur.

Hereinafter a method for manufacturing an embedded multilayer ceramic electronic component according to an embodiment of the present invention will be described, but the present invention is not limited thereto.

A method for manufacturing an embedded multilayer ceramic electronic component according to an embodiment of the present invention may include: preparing a ceramic green sheet including a dielectric layer; forming an internal electrode pattern on the ceramic green sheet by using a conductive paste for internal electrode including conductive metal powder and ceramic powder; forming an active layer including a first internal electrode and a second internal electrode disposed to face one another therein by laminating ceramic green sheets with the internal electrode pattern formed thereon and forming a cover layer by laminating a ceramic green sheet on an upper surface or a lower surface of the active layer to thus prepare a ceramic body having first and second main surfaces opposing one another, first and second lateral surfaces opposing one another, and first and second end surfaces opposing one another; inserting sandpaper in upper and lower surfaces of the ceramic body, laminating them, and compressing them; removing the sandpaper from the ceramic body; and firing the ceramic body; forming a first external electrode and a second external electrode on a first lateral surface and a second lateral surface of the ceramic body, respectively; forming a metal layer including copper (Cu) on the first and second external electrodes; and adjusting surface roughness by applying a sandblasting method to the ceramic body and a plated layer, wherein when a thickness of the metal layer is tp, tp≥5 μm may be satisfied.

In the method for manufacturing an embedded multilayer ceramic electronic component according to an embodiment of the present invention, first, a slurry including powder such as barium titanate ($BaTiO_3$) powder, or the like, may be coated on a carrier film and dried to prepare a plurality of ceramic green sheets, thus forming dielectric layers.

The ceramic green sheet may be fabricated as a sheet having a thickness of a few micrometers (μm) by mixing a ceramic powder, a binder, and a solvent to prepare a slurry and treating the slurry with a doctor blade method.

Next, a conductive paste for an internal electrode including 40 to 50 parts by weight of nickel powder having an average particle size ranging from 0.1 μm to 0.2 μm is prepared.

The conductive paste for an internal electrode is coated on the green sheet according to a screen printing method to form an internal electrode, and the internal electrodes are laminated to form an active layer, and a ceramic green sheet is laminated on an upper surface of a lower surface of the active layer to form a cover layer, thus fabricating the ceramic body 10 having first and second main surfaces opposing one another, first and second lateral surfaces opposing one another, and first and second end surfaces opposing one another.

The operation of inserting sandpaper into the upper and lower surfaces of the ceramic body 10 and laminating, compressing, and firing the same is performed to form surface roughness of the ceramic body 10. The application of sandpaper having a P value ranging from 100 to 3000 may artificially form roughness, and in this case, only roughness of a portion of the surface of the ceramic body 10 is increased. Thus, the surface roughness of the ceramic body 10 may be formed without affecting reliability of the multilayer ceramic electronic component.

In performing the compressing operation, sandpaper may be inserted into the surface of the ceramic body 10 and surface roughness of the sandpaper may be transferred to the surface of the ceramic body 10. This is to generate surface roughness on the surface of the ceramic body 10, and a P value of the sandpaper may range from 100 to 3000.

Here, 'P' of sandpaper is a symbol indicating a FEPA particle size standard [the European FEPA (Federation of European Producers of Abrasives) "P" grade].

Thereafter, an operation of forming the first and second external electrodes on the first and second lateral surfaces of the ceramic body 10, and forming metal layers 31b and 32b including copper (Cu) on the first and second external electrodes may be continued.

The operation of forming the metal layers 31b and 32b including copper (Cu) is not particularly limited. For example, the metal layer may be formed through plating.

In the forming of the metal layers 31b and 32b, a sand blasting method may be employed to artificially form and adjust surface roughness on the metal layers 31b and 32b including copper (Cu).

Through the sand blasting method, only surface roughness of the metal layers 31b and 32b including copper (Cu) may be increased without affecting reliability of the multilayer ceramic electronic component.

A description of the same characteristics as those of the embedded multilayer ceramic electronic component according to the former embodiment as described above will be omitted.

Figure 6:
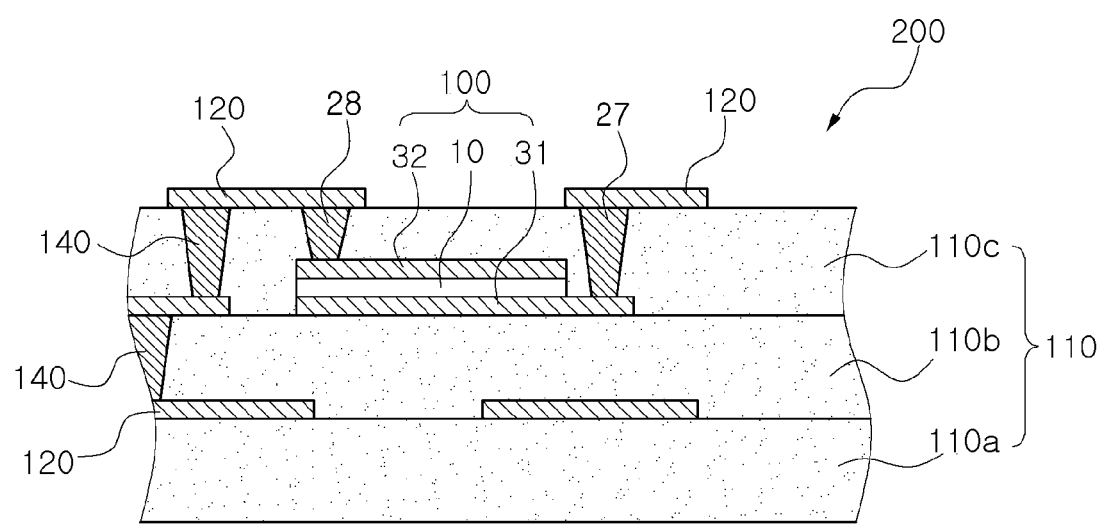
FIG. 6 is a cross-sectional view of a printed circuit board having an embedded multilayer ceramic electronic component according to another embodiment of the present invention.

FIG. 6 is a cross-sectional view of a printed circuit board 200 having an embedded multilayer ceramic electronic component according to another embodiment of the present invention.

The embedded multilayer ceramic electronic component illustrated in FIG. 6 is substantially the same as the multilayer ceramic electronic component 10 described above with reference to FIG. 6, so the same reference numerals will be used for the same or similar elements and a repeated description thereof will be omitted.

Referring to FIG. 6, the printed circuit board (PCB) 200 having embedded multilayer ceramic electronic component according to another embodiment of the present invention may include an insulating substrate 110; a ceramic body 10 including a dielectric layer 11, having first and second main surfaces S1 and S2 opposing one another, first and second lateral surfaces S5 and S6 opposing one another, and first and second end surfaces S3 and S4 opposing one another, and having a thickness equal to or less than 250 μm; a first internal electrode 21 and a second internal electrode 22 disposed to face one another with the dielectric layer 11 interposed therebetween and alternately exposed to the first lateral surface S5 and the second lateral surface S6, respectively; a first external electrode 31a formed on the first lateral surface S5 of the ceramic body 10 and electrically connected to the first internal electrode 21 and a second external electrode 32a formed on the second lateral surface S6 and electrically connected to the second internal electrode 22; and metal layers 31b and 32b formed on the first external electrode 31a and the second external electrode 32a and including copper (Cu), wherein the ceramic body 10 may include an active layer including the first internal electrodes and the second internal electrodes 21 and 22 and a cover layer formed on an upper or lower surface of the active layer, and when a thickness of the metal layers 31b and 32b is tp, tp≥5 μm may be satisfied.

The thickness is of the ceramic body 10 may be a distance between the first main surface S1 and the second main surface S2.

In the embedded MLCC 100 included in the PCB 200 according to an embodiment of the present invention, the first and second external electrodes 31 and 32 may be formed on the first and second lateral surfaces S5 and S6 of the ceramic body 10 in order to reduce a current path.

A width of the ceramic body 10 may be equal to a distance between the first lateral surface S5 on which the first external electrode 31 is formed and the second lateral surface S6 on which the second external electrode is formed, and a length L of the ceramic body 10 may be equal to a distance between the first end surface S3 and the second end surface S4.

According to an embodiment of the present invention, the width W from the first lateral surface S5 to the second lateral surface S6 on which the first and second external electrodes 31 and 32 are formed, respectively, may be shorter than or equal to the length L from the first end surface S3 to the second end surface S4.

Accordingly, the distance between the first and second external electrodes 31 and 32 is reduced, reducing a current path, and thus, a current loop is reduced to reduce inductance.

The multilayer ceramic electronic component in which the first and second external electrodes 31 and 32 are formed on the first and second lateral surfaces S5 and S6 of the ceramic body 10 so that the width W of the ceramic body 10 (namely, the distance between the first and second external electrodes 31 and 32) is shorter than or equal to the length L of the ceramic body 10 may be called a reverse geometry capacitor (RGC) or a low inductance chip capacitor (LICC).

The insulating substrate 10 may have a structure including insulating layers 110a, 110b, and 110c, and may include a conductive pattern 120 and a conductive via hole 140 constituting various types of interlayer circuits as illustrated in FIG. 6. The insulating substrate 110 may be the printed circuit board 200 including the multilayer ceramic electronic component 100 therein.

After being inserted in the PCB 200, the multilayer ceramic electronic component 100 undergoes various severe environments during a post-process such as a thermal treatment, or the like, performed on the PCB 200.

In particular, contraction and expansion of the PCB 200 during a thermal treatment process is directly transferred to the multilayer ceramic electronic component 100 inserted into the PCB 200 to apply stress to the bonding surface of the multilayer ceramic electronic component 100 and the PCB 200.

When the stress applied to the bonding surface of the multilayer ceramic electronic component 100 and the PCB 200 is higher than adhesive bonding strength, the bonding surface is separated to cause a delamination defect.

The adhesive bonding strength between the multilayer ceramic electronic component 100 and the PCB 200 is proportional to electrochemical bonding force of the multilayer ceramic electronic component 100 and the PCB 200 and an effective surface area of the bonding surface, and here, in order to enhance an effective surface area of the bonding surface between the multilayer ceramic electronic component 100 and the PCB 200, surface roughness of the multilayer ceramic electronic component 100 may be controlled to improve a delamination phenomenon between the multilayer ceramic electronic component 100 and the PCB 200. Also, frequency of delamination of the bonding surface with the PCB 200 according to surface roughness of the multilayer ceramic electronic component 100 embedded in the PCB 200 may be checked.

Hereinafter, embodiments of the present invention will be described in more detail, but the present invention is not limited thereto.

Embodiment 1

In order to determine a defective contact between embedded MLCCs, according to widths of first and second external electrodes formed on first and second main surfaces of the embedded MLCC, whether a via is processed to be defective according to thicknesses of the metal layers 31b and 32b, frequency of occurrence of delamination of bonding surfaces according to surface roughness of the metal layers 31b and 32b and surface roughness of the ceramic body 10, boards having embedded multilayer ceramic electronic components were left for 30 minutes under general conditions of chip components for mobile phone mother boards, i.e., a temperature of 85 and relative humidity of 85%, and thereafter, tested for inspection, while changing widths of the first and second external electrodes, thicknesses and surface roughness of the metal layers 31b and 32b, and surface roughness of the ceramic body 10.

Table 1 below shows defective contact between MLCCs and vias within the board according to widths of the first and second external electrodes formed on the first and second main surfaces, respectively.

TABLE 1

| Width of external electrode (μm) | Determination |
| --- | --- |
| Less than 130 | X |
| 130~140 | X |
| 140~150 | X |
| 150~160 | X |
| 160~170 | X |
| 170~180 | Δ |
| 180~190 | ○ |
| 190~200 | ○ |
| 200~210 | ⊚ |
| Greater than 210 | ⊚ |

X: greater than 20% of defect rate
: 5%~20% of defect rate
○: 0.01%~5% of defect rate
: less than 0.01% of defect rate Referring to Table 1, it can be seen that, in case of MLCCs in which the widths of the first and second external electrodes were equal to or greater than 200 μm did not have a defective contact problem with the via of the board.

Meanwhile, it can be seen that, in case of MLCCs in which the widths of the first and second external electrodes were less than 200 μm had a defective contact problem with the via of the board.

Table 2 below shows whether via was processed to be defective according to thicknesses of the metal layers 31b and 32b.

TABLE 2

| Thickness of metal layer (μm) | Determination |
| --- | --- |
| Less than 1 | X |
| 1~2 | X |
| 2~3 | X |
| 3~4 | Δ |
| 4~5 | ○ |
| 5~6 | ⊚ |
| Greater than 6 | ⊚ |

X: greater than 10% of defect rate
: 1%~10% of defect rate
○: 0.01%~1% of defect rate
: less than 0.01% of defect rate Referring to Table 2, it can be seen that, in the case of MLCCs in which the thickness of the metal layers 31b and 32b was equal to or greater than 5 μm, the vias were excellently processed in the board, and thus, the MLCC having excellent reliability was implemented.

Meanwhile, it can be seen that, in case of MLCCs in which the thickness of the metal layers 31b and 32b was less than 5 μm, the vias were processed to be defective.

Table 3 below shows frequency of delamination of bonding surfaces according to surface roughness of the metal layers 31b and 32b.

TABLE 3

| Surface roughness of metal layer (nm) | Determination |
| --- | --- |
| Less than 50 | X |
| 50~100 | X |
| 100~150 | Δ |
| 150~200 | ○ |
| 200~250 | ⊚ |
| Greater than 250 | ⊚ |

X: greater than 5% of defect rate
: 1%~5% of defect rate
○: 0.01%~1% of defect rate
: less than 0.01% of defect rate Referring to Table 3, it can be seen that, in case of MLCCs in which surface roughness of the metal layers 31b and 32b was equal to or greater than 200 nm, frequency of delamination of the bonding surface was low, implementing MLCCs having excellent reliability.

Meanwhile, it can be seen that, in the case of MLCCs in which surface roughness of the metal layers 31b and 32b was less than 200 nm, frequency of delamination of the bonding surface was high, degrading reliability.

Table 4 below shows frequency of delamination of the bonding surfaces of surface roughness of the ceramic body 10.

TABLE 4

| Surface roughness of ceramic body (nm) | Determination |
| --- | --- |
| Less than 50 | X |
| 50~80 | X |
| 80~100 | Δ |
| 100~120 | ○ |
| 120~200 | ⊚ |
| Greater than 200 | ⊚ |

X: greater than 5% of defect rate
: 1%~5% of defect rate
○: 0.01%~1% of defect rate
: less than 0.01% of defect rate Referring to FIG. 4, it can be seen that, in the case of MLCCs in which surface roughness of the ceramic body 10 was equal to or greater than 120 nm, frequency of delamination of the bonding surface was low, implementing MLCCs having excellent reliability.

Meanwhile, it can be seen that, in case of MLCCs in which surface roughness of the ceramic body 10 was less than 120 nm, frequency of delamination of the bonding surface was high, degrading reliability.

As set forth above, according to embodiments of the invention, when the ceramic body is compressed, sandpaper is inserted onto the surface to transfer roughness of the sandpaper to the ceramic body, thus adjusting roughness of the surface of the ceramic body, and surface roughness of the plated layers is adjusted by processing the chip including the plated layer according to sand blast method, whereby delamination between the multilayer ceramic electronic component and the board can be improved and bonding characteristics can be enhanced.

In addition, the multilayer ceramic electronic component according to an embodiment of the present invention has low inductance, and thus, it can have enhanced electrical performance.

While the present invention has been shown and described in connection with the embodiments, it will be apparent to those skilled in the art that modifications and variations can be made without departing from the spirit and scope of the invention as defined by the appended claims.

What is claimed is:

1. An embedded multilayer ceramic electronic component comprising:

a ceramic body including dielectric layers, having first and second main surfaces opposing one another, first and second lateral surfaces opposing one another, and first and second end surfaces opposing one another, and having a thickness equal to or less than 250 μm;

a first internal electrode and a second internal electrode disposed to face one another with the dielectric layer interposed therebetween and alternately exposed to the first lateral surface and the second lateral surface, respectively;

a first external electrode formed on the first lateral surface of the ceramic body and electrically connected to the first internal electrode and a second external electrode formed on the second lateral surface and electrically connected to the second internal electrode; and metal layers being copper plating layers, and disposed on the first external electrode and the second external electrode, respectively, wherein the ceramic body includes an active layer including the first internal electrodes and the second internal electrodes and a cover layer formed on an upper or lower surface of the active layer, and when a thickness of the metal layers is tp, tp≥5 µm is satisfied, and wherein when surface roughness of the metal layers is Ra2 and the thickness of the metal layers is tp, 200 nm≤Ra2≤tp is satisfied.

2. The embedded multilayer ceramic electronic component of claim 1, wherein when a thickness of the ceramic body is a distance between the first main surface and the second main surface, a width of the ceramic body is a distance between the first lateral surface on which the first external electrode is formed and the second lateral surface on which the second external electrode is formed, and a length of the ceramic body is a distance between the first end surface and the second end surface, the width of the ceramic body is shorter than or equal to the length of the ceramic body.

3. The embedded multilayer ceramic electronic component of claim 2, wherein when the length of the ceramic body is L and the width thereof is W, 0.5 L≤W≤L is satisfied.

4. The embedded multilayer ceramic electronic component of claim 1, wherein when surface roughness of the ceramic body is Ra1 and a thickness of the cover layer is tc, 120 nm≤Ra1≤tc is satisfied.

5. The embedded multilayer ceramic electronic component of claim 1, wherein the first and second external electrodes extend to the first and second main surfaces of the ceramic body, and a width of the first and second external electrodes formed on the first and second main surfaces is equal to or greater than 200 µm, respectively.

6. The embedded multilayer ceramic electronic component of claim 5, wherein a distance between the first and second external electrodes formed on the first and second main surfaces is equal to or greater than 100 µm.

7. The embedded multilayer ceramic electronic component of claim 1, wherein the thickness tc of the cover layer ranges from 1 µm to 30 µm.

8. The embedded multilayer ceramic electronic component of claim 1, wherein the metal layers are formed through plating.

9. A printed circuit board (PCB) having an embedded multilayer ceramic electronic component, the printed circuit board comprising:

an insulating substrate; and an embedded multilayer ceramic electronic component including a ceramic body including dielectric layers, having first and second main surfaces opposing one another, first and second lateral surfaces opposing one another, and first and second end surfaces opposing one another, and having a thickness equal to or less than 250 µm, a first internal electrode and a second internal electrode disposed to face one another with the dielectric layer interposed therebetween and alternately exposed to the first lateral surface and the second lateral surface, respectively, a first external electrode formed on the first lateral surface of the ceramic body and electrically connected to the first internal electrode and a second external electrode formed on the second lateral surface and electrically connected to the second internal electrode, and metal layers being copper plating layers, and disposed on the first external electrode and the second external electrode, respectively, wherein the ceramic body includes an active layer including the first internal electrodes and the second internal electrodes and a cover layer formed on an upper or lower surface of the active layer, and when a thickness of the metal layers is tp, tp≥5 µm is satisfied, and wherein when surface roughness of the metal layers is Ra2 and the thickness of the metal layers is tp, 200 nm≤Ra2≤tp is satisfied.

10. The printed circuit board of claim 9, wherein when a thickness of the ceramic body is a distance between the first main surface and the second main surface, a width of the ceramic body is a distance between the first lateral surface on which the first external electrode is formed and the second lateral surface on which the second external electrode is formed, and a length of the ceramic body is a distance between the first end surface and the second end surface, the width of the ceramic body is shorter than or equal to the length of the ceramic body.

11. The printed circuit board of claim 10, wherein when the length of the ceramic body is L and the width thereof is W, 0.5 L≤W≤L is satisfied.

12. The printed circuit board of claim 9, wherein when surface roughness of the ceramic body is Ra1 and a thickness of the cover layer is tc, 120 nm≤Ra1≤tc is satisfied.

13. The printed circuit board of claim 9, wherein the first and second external electrodes extend to the first and second main surfaces of the ceramic body, and a width of the first and second external electrodes formed on the first and second main surfaces is equal to or greater than 200 µm, respectively.

14. The printed circuit board of claim 13, wherein a distance between the first and second external electrodes formed on the first and second main surfaces is equal to or greater than 100 µm.

15. The printed circuit board of claim 9, wherein the thickness tc of the cover layer ranges from 1 µm to 30 µm.

16. The printed circuit board of claim 9, wherein the metal layers are formed through plating.

* * * * *